(12) United States Patent
Pavol et al.

(10) Patent No.: US 8,247,255 B2
(45) Date of Patent: Aug. 21, 2012

(54) MODULAR SYSTEM AND PROCESS FOR CONTINUOUS DEPOSITION OF A THIN FILM LAYER ON A SUBSTRATE

(75) Inventors: Mark Jeffrey Pavol, Arvada, CO (US); Russell Weldon Black, Longmont, CO (US); Brian Robert Murphy, Golden, CO (US); Christopher Rathweg, Louisville, CO (US); Edwin Jackson Little, Denver, CO (US); Max William Reed, Niwot, CO (US)

(73) Assignee: PrimeStar, Inc., Arvada, CO (US)

( * ) Notice: Subject to any disclaimer, the term of this patent is extended or adjusted under 35 U.S.C. 154(b) by 233 days.

(21) Appl. No.: 12/638,653

(22) Filed: Dec. 15, 2009

(65) Prior Publication Data

US 2011/0143478 A1 Jun. 16, 2011

(51) Int. Cl.
*H01L 21/00* (2006.01)
(52) U.S. Cl. ........ 438/57; 438/61; 438/62; 257/E21.001
(58) Field of Classification Search .................... 438/57; 257/E21.001
See application file for complete search history.

(56) References Cited

U.S. PATENT DOCUMENTS

| | | | |
|---|---|---|---|
| 4,485,125 A * | 11/1984 | Izu et al. .................... | 427/74 |
| 4,492,181 A * | 1/1985 | Ovshinsky et al. ........... | 118/718 |
| 5,248,349 A | 9/1993 | Foote et al. | |
| 5,304,499 A | 4/1994 | Bonnet et al. | |
| 5,366,764 A | 11/1994 | Sunthankar | |
| 5,372,646 A | 12/1994 | Foote et al. | |
| 5,470,397 A | 11/1995 | Foote et al. | |
| 5,536,333 A | 7/1996 | Foote et al. | |
| 5,712,187 A | 1/1998 | Li et al. | |
| 5,994,642 A | 11/1999 | Higuchi et al. | |
| 6,423,565 B1 | 7/2002 | Barth et al. | |
| 6,444,043 B1 | 9/2002 | Gegenwart et al. | |
| 6,719,848 B2 | 4/2004 | Faykosh et al. | |
| 7,194,197 B1 | 3/2007 | Wendt et al. | |

(Continued)

FOREIGN PATENT DOCUMENTS

EP 0853345 A1 7/1998

(Continued)

OTHER PUBLICATIONS

European Search Report issued in connection with EP Application No. 10192851.3, Jan. 21, 2011.

*Primary Examiner* — Angel Roman
(74) *Attorney, Agent, or Firm* — Dority & Manning, P.A.

(57) ABSTRACT

A process and associated system for vapor deposition of a thin film layer on a photovoltaic (PV) module substrate is includes establishing a vacuum chamber and introducing the substrates individually into the vacuum chamber. The substrates are pre-heated as they are conveyed through the vacuum chamber, and are then conveyed in serial arrangement through a vapor deposition apparatus in the vacuum chamber wherein a thin film of a sublimed source material is deposited onto an upper surface of the substrates. The substrates are conveyed through the vapor deposition apparatus at a controlled constant linear speed such that leading and trailing sections of the substrate in a conveyance direction are exposed to the same vapor deposition conditions within the vapor deposition apparatus. The vapor deposition apparatus may be supplied with source material in a manner so as not to interrupt the vapor deposition process or non-stop conveyance of the substrates through the vapor deposition apparatus.

16 Claims, 2 Drawing Sheets

| U.S. PATENT DOCUMENTS | | |
|---|---|---|
| 2002/0117199 A1 | 8/2002 | Oswald |
| 2003/0044539 A1 | 3/2003 | Oswald |
| 2007/0007109 A1 | 1/2007 | Powell et al. |
| 2009/0194165 A1 | 8/2009 | Murphy et al. |
| 2009/0215224 A1* | 8/2009 | Li et al. .................. 438/102 |
| 2010/0055827 A1* | 3/2010 | Barth et al. ................ 438/94 |

| FOREIGN PATENT DOCUMENTS | | |
|---|---|---|
| EP | 1260605 A1 | 11/2002 |
| WO | 9009466 A1 | 8/1990 |
| WO | 2005086238 A1 | 9/2005 |
| WO | 2006053128 A2 | 5/2006 |

* cited by examiner

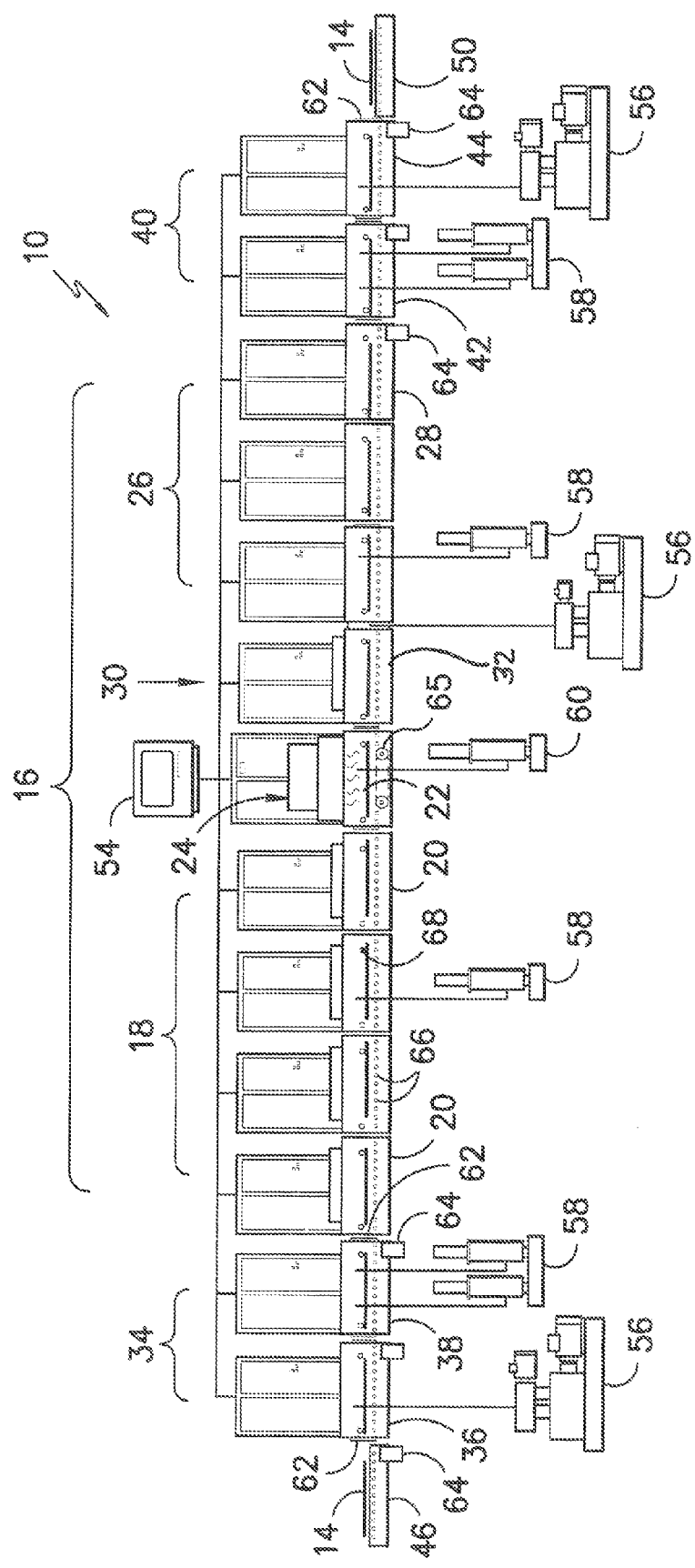
FIG. -1-

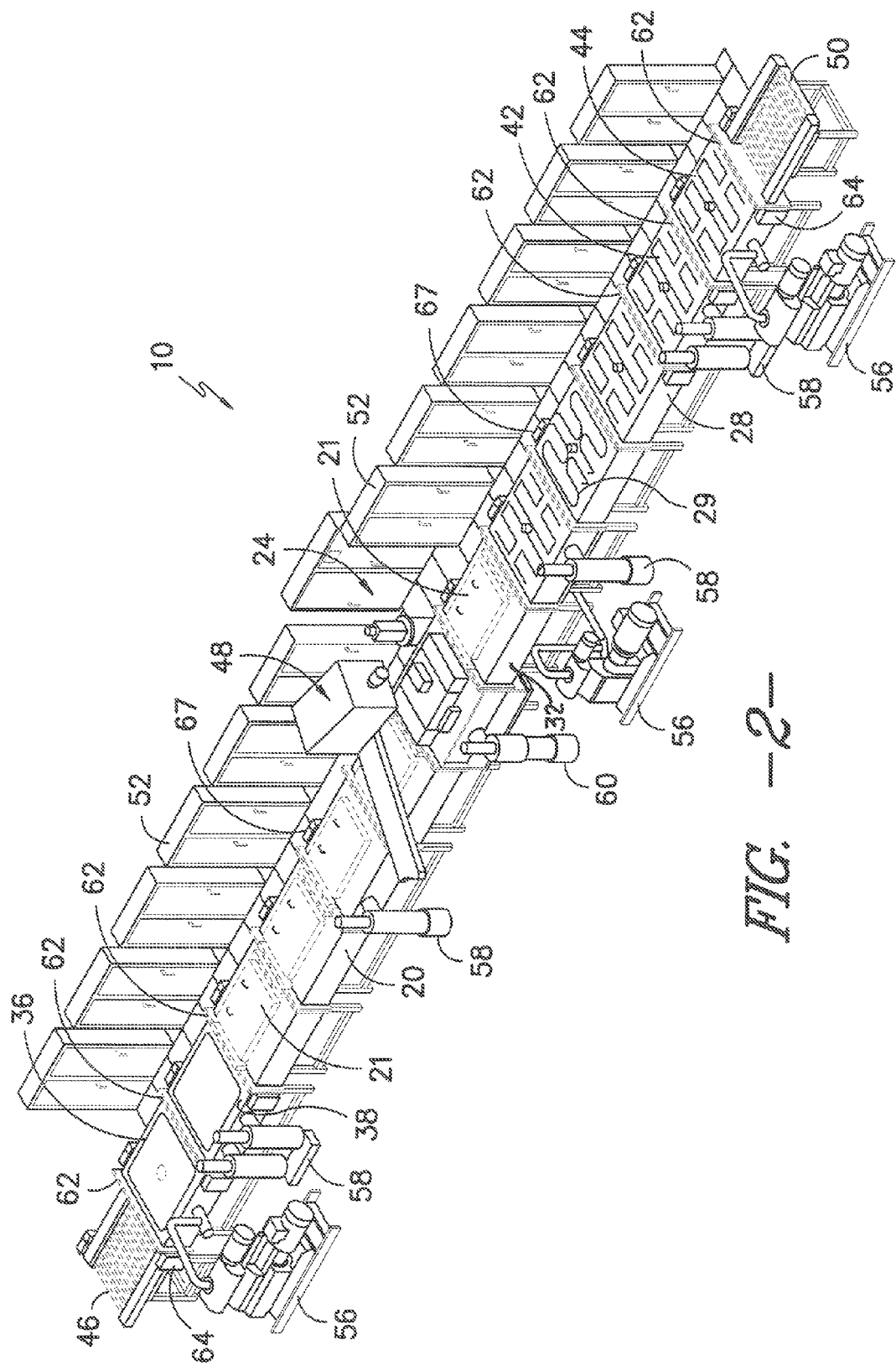
FIG. -2-

MODULAR SYSTEM AND PROCESS FOR CONTINUOUS DEPOSITION OF A THIN FILM LAYER ON A SUBSTRATE

FIELD OF THE INVENTION

The subject matter disclosed herein relates generally to the field of thin film deposition processes wherein a thin film layer, such as a semiconductor material layer, is deposited on a substrate. More particularly, the disclosed subject matter is related to a system and process for depositing a thin film layer of a photo-reactive material on a glass substrate in the formation of photovoltaic (PV) modules.

BACKGROUND OF THE INVENTION

Thin film photovoltaic (PV) modules (also referred to as "solar panels" or "solar modules") based on cadmium telluride (CdTe) paired with cadmium sulfide (CdS) as the photo-reactive components are gaining wide acceptance and interest in the industry. CdTe is a semiconductor material having characteristics particularly suited for conversion of solar energy (sunlight) to electricity. For example, CdTe has an energy bandgap of 1.45 eV, which enables it to convert more energy from the solar spectrum as compared to lower bandgap (1.1 eV) semiconductor materials historically used in solar cell applications. Also, CdTe converts energy more efficiently in lower or diffuse light conditions as compared to the lower bandgap materials and, thus, has a longer effective conversion time over the course of a day or in low-light (e.g., cloudy) conditions as compared to other conventional materials.

Solar energy systems using CdTe PV modules are generally recognized as the most cost efficient of the commercially available systems in terms of cost per watt of power generated. However, the advantages of CdTe not withstanding, sustainable commercial exploitation and acceptance of solar power as a supplemental or primary source of industrial or residential power depends on the ability to produce efficient PV modules on a large scale and in a cost effective manlier.

Certain factors affect the efficiency of CdTe PV modules in terms of cost and power generation capacity of the modules. For example, CdTe is relatively expensive and, thus, efficient utilization (i.e., minimal waste) of the material is a primary cost factor. In addition, the energy conversion efficiency of the module is a factor of certain characteristics of the deposited CdTe film layer. Non-uniformity or defects in the film layer can significantly decrease the output of the module, thereby adding to the cost per unit of power. Also, the ability to process relatively large substrates on an economically sensible commercial scale is a crucial consideration.

CSS (Close Space Sublimation) is a known commercial vapor deposition process for production of CdTe modules. Reference is made, for example, to U.S. Pat. No. 6,444,043 and U.S. Pat. No. 6,423,565. Within the deposition chamber in a CSS process, the substrate is brought to an opposed position at a relatively small distance (i.e., about 2-3 mm) opposite to a CdTe source. The CdTe material sublimes and deposits onto the surface of the substrate. In the CSS system of U.S. Pat. No. 6,444,043 cited above, the CdTe material is in granular form and is held in a heated receptacle within the vapor deposition chamber. The sublimed material moves through holes in a cover placed over the receptacle and deposits onto the stationary glass surface, which is held at the smallest possible distance (1-2 mm) above the cover frame. The cover is heated to a temperature greater than the receptacle.

While there are advantages to the CSS process, the system is inherently a batch process wherein the glass substrate is indexed into a vapor deposition chamber, held in the chamber for a finite period of time in which the film layer is formed, and subsequently indexed out of the chamber. The system is more suited for batch processing of relatively small surface area substrates. The process must be periodically interrupted in order to replenish the CdTe source, which is detrimental to a large scale production process. In addition, the deposition process cannot be readily stopped and restarted in a controlled manner, resulting in significant non-utilization (i.e., waste) of the CdTe material during the indexing of the substrates into and out of the chamber, and during any steps needed to position the substrate within the chamber.

Accordingly, there exists an ongoing need in the industry for an improved system and method for economically feasible large scale production of efficient PV modules, particularly CdTe based modules.

BRIEF DESCRIPTION OF THE INVENTION

Aspects and advantages of the invention will be set forth in part in the following description, or may be obvious from the description, or may be learned through practice of the invention.

In accordance with an embodiment of the invention, a process is provided for vapor deposition of a thin film layer, such as a CdTe layer, on a photovoltaic (PV) module substrate. A "thin" film layer is generally recognized in the art as less than 10 microns ($\mu$m), although the invention is not limited to any particular film thickness. The process includes establishing a vacuum chamber and introducing the substrates individually into the vacuum chamber. The substrates are pre-heated as they are conveyed through the vacuum chamber. The heated substrates are then conveyed in a serial (i.e., end-to-end) configuration into and through a vapor deposition apparatus in the vacuum chamber wherein a thin film of a sublimated source material is deposited onto a top surface of the substrates. The substrates are conveyed at a controlled, constant linear conveyance rate through the vapor deposition apparatus such that the leading and trailing sections of the substrates in the direction of conveyance are exposed to the same vapor deposition conditions within the vapor deposition apparatus. In this manner, a desired substantially uniform thickness of the film layer is obtained on the surface of the continuously moving substrate.

Desirably, the vapor deposition apparatus is supplied with source material, for example a granular CdTe material, in a manner that does not require interruption of the continuous vapor deposition process or conveyance of the substrates through the vapor deposition chamber.

Variations and modifications to the process discussed above are within the scope and spirit of the invention and may be further described herein.

In accordance with another embodiment of the present invention, a system is provided for vapor deposition of a thin film layer, such as a CdTe film layer, on photovoltaic (PV) module substrates. The system includes a vacuum chamber, which may be defined by a plurality of interconnected modules in a particular embodiment. The vacuum chamber includes a pre-heat section, a vapor deposition apparatus, and a cool-down section. A conveyor system is operably disposed within the vacuum chamber and is configured for conveying the substrates in a serial arrangement from the pre-heat section, through the vapor deposition apparatus, and through the cool-down section. In the unique modular embodiment mentioned above, the conveyor system may include an individually controlled conveyor associated with each respective module, wherein the plurality of conveyors are controlled to achieve a desired conveyance rate of the substrates through the various sections of the vacuum chamber. The vapor deposition apparatus is configured for continuous vapor deposition wherein a thin film of a sublimed source material is deposited onto a top surface of the substrates as the substrates are continuously conveyed through the vapor deposition apparatus. The substrates are conveyed at a controlled constant linear conveyance rate through the vapor deposition apparatus to achieve a desired uniform thickness of the thin film layer on the surface of the substrate.

A feed system may be operably configured with the vapor deposition apparatus to supply the apparatus with source material, such as a granular CdTe material, without interrupting the continuous vapor deposition process or non-stop conveyance of the substrates through the apparatus.

Variations and modifications to the embodiment of the system assembly discussed above are within the scope and spirit of the invention and may be further described herein.

These and other features, aspects and advantages of the present invention will become better understood with reference to the following description and appended claims.

BRIEF DESCRIPTION OF THE DRAWING

A full and enabling disclosure of the present invention, including the best mode thereof, is set forth in the specification, which makes reference to the appended drawings, in which:

FIG. 1 is a plan view of an embodiment of a system in accordance with aspects of the invention; and, FIG. 2 is a perspective view of the embodiment of the system of FIG. 1.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment, can be used with another embodiment to yield a still further embodiment. Thus, it is intended that the present invention encompass such modifications and variations as come within the scope of the appended claims and their equivalents.

FIGS. 1 and 2 illustrate an embodiment of a system 10 configured for vapor deposition of a thin film layer on a photovoltaic (PV) module substrate 14 (referred to hereafter as a "substrate"). The thin film may be, for example, a film layer of cadmium telluride (CdTe). Although the invention is not limited to any particular film thickness, as mentioned, it is generally recognized in the art that a "thin" film layer on a PV module substrate is generally less than about 10 microns (μm). It should be appreciated that the present system is not limited to vapor deposition of a particular type of film layer, and that CdTe is just one type of film layer that may be deposited by the system 10.

Referring to FIG. 1, the system 10 includes a vacuum chamber 16, which may be defined by any configuration of components. In the particular illustrated embodiment, the vacuum chamber 16 is defined by a plurality of interconnected modules, as discussed in greater detail below. In general, the vacuum chamber 16 may be considered as the section or portion of the system 10 wherein a vacuum is drawn and maintained for the various aspects of the vapor deposition process.

The system 10 includes a preheat section 18 within the vacuum chamber 16. The preheat section 18 may be one or a plurality of components that preheat the substrates 14 as they are conveyed through the vacuum chamber 16. In the illustrated embodiment, the preheat section 18 is defined by a plurality of interconnected modules 20 through which the substrates 14 are conveyed.

The vacuum chamber 16 also includes a vapor deposition apparatus 24 downstream of the preheat section 18 in the direction of conveyance of the substrates 14. This apparatus 24 may be configured as a vapor deposition module 22 and is the component configuration wherein a source material, such as granular CdTe material, is sublimated and deposited onto the substrate 14 as a thin film layer. It should be readily appreciated that various vapor deposition systems and processes are known in the art, such as the CSS systems discussed above, and that the vapor deposition apparatus 24 is not limited to any particular type of vapor deposition system or process.

The vacuum chamber 16 also includes a cool-down section 26 downstream of the vapor deposition apparatus 24. In the illustrated embodiment, the cool-down section 26 is defined by a plurality of interconnected cool-down modules 28 through which the substrates 14 are conveyed prior to being removed from the system 10, as described in greater detail below.

The system 10 also includes a conveyor system that is operably disposed within the vacuum chamber 16. In the illustrated embodiment, this conveyor system 16 includes a plurality of individual conveyors 66, with each of the modules in the system 10 including a respective one of the conveyors 66. It should be appreciated that the type or configuration of the conveyors 66 is not a limiting factor of the invention. In the illustrated embodiment, the conveyors 66 are roller conveyors driven by a motor drive 67 (FIG. 2) that is controlled so as to achieve a desired conveyance rate of the substrates 14 through a respective module, and the system 10 overall.

The system 10 also includes a feed system 48 (FIG. 2) that is configured with the vapor deposition apparatus 24 to supply the apparatus 24 with source material, such as granular CdTe material. The feed system 48 may take on various configurations within the scope and spirit of the invention, and functions so as to supply the source material without interrupting the continuous vapor deposition process within the vapor deposition apparatus 24 or conveyance of the substrates 14 through the vapor deposition apparatus 24.

Referring to FIGS. 1 and 2 in general, the individual substrates 14 are initially placed onto a load conveyor 46, which may include, for example, the same type of driven roller conveyor 66 that is utilized in the other system modules. The substrates 14 are first conveyed through an entry vacuum lock station 34 that is upstream of the vacuum chamber 16. In the illustrated embodiment, the vacuum lock station 34 includes a load module 36 upstream of a buffer module 38 in the direction of conveyance of the substrates 14. A "rough" (i.e., initial) vacuum pump 56 is configured with the load module 36 to drawn an initial vacuum level, and a "fine" (i.e., high) vacuum pump 58 is configured with the buffer module 38 to increase the vacuum in the buffer module 38 to essentially the vacuum level within the vacuum chamber 16. Valves 62 (e.g., gate-type slit valves or rotary-type flapper valves) are operably disposed between the load conveyor 46 and the load module 36, between the load module 36 and the buffer module 38, and between the buffer module 38 and the vacuum chamber 16. These valves 62 are sequentially actuated by a motor or other type of actuating mechanism 64 in order to introduce the substrates 14 into the vacuum chamber 16 in a step-wise manner without adversely affecting the vacuum within the chamber 16.

Under normal operating conditions, an operational vacuum is maintained in the vacuum chamber 16 by way of any combination of vacuum pumps 58, 56, and 60. In order to introduce a substrate 14 into the vacuum chamber 16, the valve 62 between the load module 36 and buffer module 38 is initially closed and the load module is vented. The valve 62 between the buffer module 38 and first pre-heat module 20 is closed. The valve 62 between the load module 36 and load conveyor 46 is opened and the individual conveyors 66 in the respective modules are controlled so as to advance a substrate 14 into the load module 36. At this point, the first valve 62 is shut and the substrate 14 is isolated in the load module 36. The rough vacuum pump 56 then draws an initial vacuum in the load module 36. During this time, the fine vacuum pump 58 draws a vacuum in the buffer module 38. When the vacuum between the load module 36 and buffer module 38 are substantially equalized, the valve 62 between the modules is opened and the substrate 14 is moved into the buffer module 38. The valve 62 between the modules is closed and the fine vacuum pump 58 increases the vacuum in the buffer module 38 until it is substantially equalized with the adjacent pre-heat module 20. The valve 62 between the buffer module 38 and pre-heat module 20 is then opened and the substrate is moved into the pre-heat module 20. The process repeats for each subsequent substrate 14 conveyed into the vacuum chamber 16.

In the illustrated embodiment, the preheat section 18 is defined by a plurality of interconnected modules 20 that define a heated conveyance path for the substrates 14 through the vacuum chamber 16. Each of the modules 20 may include a plurality of independently controlled heaters 21, with the heaters 21 defining a plurality of different heat zones. A particular heat zone may include more than one heater 21.

Each of the preheat modules 20 also includes an independently controlled conveyor 66. The heaters 21 and conveyors 66 are controlled for each module 20 so as to achieve a conveyance rate of the substrates 14 through the preheat section 18 that ensures a desired temperature of the substrates 14 prior to conveyance of the substrates 14 into a downstream vapor deposition module 22.

In the illustrated embodiment, the vapor deposition apparatus 24 includes a module 22 in which the substrates 14 are exposed to a vapor deposition environment wherein a thin film of sublimed source material, such as CdTe, is deposited onto the upper surface of the substrates 14. The individual substrates 14 are conveyed through the vapor deposition module 22 at a controlled constant linear speed. In other words, the substrates 14 are not stopped or held within the module 22, but move continuously through the module 22 at a controlled linear rate. The conveyance rate of the substrates 14 may be in the range of, for example, about 10 mm/sec to about 40 mm/sec. In a particular embodiment, this rate may be, for example, about 20 mm/sec. In this manner, the leading and trailing sections of the substrates 14 in the conveyance direction are exposed to the same vapor deposition conditions within the vapor deposition module 22. All regions of the top surface of the substrates 14 are exposed to the same vapor conditions so as to achieve a substantially uniform thickness of the thin film layer of sublimated source material on the upper surface of the substrates 14.

The vapor deposition module 22 includes a respective conveyor 65, which may be different from the conveyors 66 in the plurality of upstream and downstream modules. Conveyor 65 may be particularly configured to support the vapor deposition process within the module 22. In the embodiment illustrated, an endless slat conveyor 65 is configured within the module 22 for this purpose. It should be readily appreciated, however, that any other type of suitable conveyor may also be used.

The vapor deposition apparatus 24 is configured with a feed system 48 (FIG. 2) to continuously supply the apparatus 24 with source material in a manner so as not to interrupt the vapor deposition process or non-stop conveyance of the substrates 14 through the module 22. The feed system 48 is not a limiting factor of the invention, and any suitable feed system 48 may be devised to supply the source material into the apparatus 24. For example, the feed system 48 may include sequentially operated vacuum locks wherein an external source of the material is introduced as metered doses in a step-wise manner through the vacuum locks and into a receptacle within the vapor deposition apparatus 24. The supply of source material is considered "continuous" in that the vapor deposition process need not be stopped or halted in order to re-supply the apparatus 24 with source material. So long as the external supply is maintained, the feed system 48 will continuously supply batches or metered doses of the material into the vapor deposition apparatus 24.

In the illustrated embodiment, a post-heat section 30 is defined within the vacuum chamber 16 immediately downstream of the vapor deposition module 22. This post-heat section 30 may be defined by at least one post-heat module 32 having a heater unit 21 configured therewith. As the leading section of a substrate 14 is conveyed out of the vapor deposition module 22, it moves into the post-heat module 32. The post-heat module 32 maintains the temperature of the substrate 14 at essentially the same temperature as the vapor deposition module 24. In this way, leading section of the substrate 14 is not allowed to cool while the trailing section is still within the vapor deposition module 22. If the leading section of the substrate 14 were allowed to cool as it exited the module 22, a non-uniform temperature profile would be generated longitudinally along the substrate 14. This condition could result in breaking, cracking, or warping of the substrate from thermal stress.

A cool-down section 26 is downstream of the post-heat section 30 within the vacuum chamber 16. The cool-down section 26 may include one or more cool-down modules 28 having independently controlled conveyors 66. The cool-down modules 28 define a longitudinally extending section within the vacuum chamber 16 in which the substrates having the thin film of sublimed source material deposited thereon are allowed to cool at a controlled cool-down rate prior to the substrates 14 being removed from the system 10. Each of the modules 28 may include a forced cooling system wherein a cooling medium, such as chilled water, refrigerant, or other medium is pumped through cooling coils 29 configured with the modules 28, as particularly illustrated in FIG. 2.

An exit vacuum lock station 40 is configured downstream of the cool-down section 26. This exit station 40 operates essentially in reverse of the entry vacuum lock station 34 described above. For example, the exit vacuum lock station 40 may include an exit buffer module 42 and a downstream exit lock module 44. Sequentially operated valves 62 are disposed between the buffer module 42 and the last one of the modules 28 in the cool-down section 26, between the exit buffer module 42 and the exit lock module 44, and between the exit lock module 44 and an exit conveyor 50. A fine vacuum pump 58 is configured with the exit buffer module 42, and a rough vacuum pump 56 is configured with the exit lock module 44. The pumps 58, 60, and valves 62 are sequentially operated (essentially in reverse of the entry lock station 34) to move the substrates 14 out of the vacuum chamber 16 in a step-wise fashion without loss of vacuum condition within the vacuum chamber 16.

As mentioned, in the embodiment illustrated, the system 10 is defined by a plurality of interconnected modules, with each of the modules serving a particular function. For example, modules 36 and 38 function to introduce individual substrates 14 into the vacuum chamber 16. The conveyors 66 configured with these respective modules are appropriately controlled for this purpose, as well as the valves 62 and associated actuators 64. The conveyors 66 and heater units 21 associated with the plurality of modules 20 in the pre-heat section 18 are controlled to pre-heat the substrates 14 to a desired temperature, as well as to ensure that the substrates 14 are introduced into the vapor deposition module 22 at the desired controlled, constant linear conveyance rate. For control purposes, each of the individual modules may have an associated independent controller 52 configured therewith to control the individual functions of the respective module. The plurality of controllers 52 may, in turn, be in communication with a central system controller 54, as illustrated in FIG. 1. The central system controller 54 can monitor and control (via the independent controllers 52) the functions of any one of the modules so as to achieve an overall desired conveyance rate and processing of the substrates 14 through the system 10.

Referring to FIG. 1, for independent control of the individual respective conveyor 66, each of the modules may include any manner of active or passive sensors 68 that detect the presence of the substrates 14 as they are conveyed through the module. The sensors 68 are in communication with the module controller 52, which is in turn in communication with the central controller 54. In this manner, the individual respective conveyor 66 may be controlled to ensure that a proper spacing between the substrates 14 is maintained and that the substrates 14 are conveyed at the desired constant conveyance rate through the vacuum chamber 16.

The present invention also encompasses various process embodiments for vapor deposition of a thin film layer on a photovoltaic (PV) module substrate. The processes may be practiced with the various system embodiments described above or by any other configuration of suitable system components. It should thus be appreciated that the process embodiments according to the invention are not limited to the system configuration described herein.

In a particular embodiment, the process includes establishing a vapor chamber and introducing PV substrates individually into the chamber. The substrates are preheated to a desired temperature as they are conveyed through the vacuum chamber in a serial arrangement. The preheated substrates are then conveyed through a vapor deposition apparatus within the vacuum chamber wherein a thin film of a sublimated source material, such as CdTe, is deposited onto the upper surface of the substrates. The substrates are conveyed through the vapor deposition apparatus at a controlled constant linear speed such that the leading and trailing sections of the substrates in a conveyance direction are exposed to the same vapor deposition conditions within the vapor deposition apparatus so as to achieve a uniform thickness of the thin film layer on the upper surface of the substrates.

In a unique embodiment, the vapor deposition apparatus is supplied with source material in a manner so as not to interrupt the vapor deposition process or conveyance of the substrates through the vapor deposition apparatus.

The process may further include cooling the substrates downstream of the vapor deposition apparatus within the vacuum chamber prior to subsequent removal of each of the cooled substrates from the vacuum chamber.

It may be desired to post-heat the substrates as they exit the vapor deposition apparatus prior to cooling the substrates such that the leading section of the substrates in the direction of conveyance is not cooled until the entire substrate has exited the vapor deposition apparatus. In this manner, the substrate is kept at a relatively constant temperature along its longitudinal length while the trailing section of the substrate is undergoing the deposition process within the vapor deposition apparatus.

As mentioned, the substrates are conveyed through the vapor deposition apparatus at a constant linear speed. In a unique embodiment, the substrates may be conveyed through the other sections of the vacuum chamber at a variable speed. For example, the substrates may be conveyed at a slower or faster speed, or step-wise, as they are pre-heated before the vapor deposition apparatus, or as they are cooled after the vapor deposition apparatus.

The process may also include individually introducing the substrates into and out of the vacuum chamber through an entry and exit vacuum lock process wherein the vacuum conditions within the vacuum chamber are not interrupted or changed to any significant degree.

In order to sustain a continuous vapor deposition process, the process also may include supplying the source material to the vapor deposition apparatus from an externally refillable feed system. The feed process may include continuously introducing metered doses of the source material from the feed system into the vapor deposition apparatus without interrupting the vapor deposition process. For example, the metered doses of source material may be introduced through sequential vacuum locks and deposited into a receptacle within the vapor deposition apparatus. In this manner, the vapor deposition process need not be interrupted to refill the source material within the vapor deposition apparatus.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A process for vapor deposition of a thin film layer on a photovoltaic module substrate, comprising:

establishing a vacuum chamber maintained at an operation vacuum;

introducing substrates individually into the vacuum chamber such that the vacuum chamber is maintained at the operational vacuum;

pre-heating the substrates as the substrates are conveyed through the vacuum chamber; and conveying the pre-heated substrates in serial arrangement through a vapor deposition apparatus in the vacuum chamber wherein a thin film layer of a sublimed source material is deposited onto an upper surface of the substrates in the vapor deposition apparatus;

wherein the substrates are conveyed through the vapor deposition apparatus at a controlled constant linear speed such that leading and trailing sections of the substrate in a conveyance direction are exposed to the same vapor deposition conditions within the vapor deposition apparatus to achieve a substantially uniform thickness of the thin film layer on an upper surface of the substrate.

2. The process as in claim 1, further comprising cooling the substrates downstream of the vapor deposition apparatus within the vacuum chamber, and subsequently individually removing each of the cooled substrates from the vacuum chamber.

3. The process as in claim 2, further comprising post-heating the substrates as the substrates exit the vapor deposition apparatus and prior to cooling the substrates so that the substrates are not cooled until the entire substrate has exited the vapor deposition apparatus.

4. The process as in claim 1, wherein the substrates are individually introduced into the vacuum chamber through an entry vacuum lock process, and individually removed from the vacuum chamber through an exit vacuum lock process such that vacuum within the vacuum chamber is maintained during entry and exit of the substrates.

5. The process as in claim 1, wherein the vacuum chamber is defined by a plurality of interconnected modular units, with each of the modular units having an independent conveyor, the process further comprising controlling the individual conveyors to achieve an overall continuous flow of the substrates through the vacuum chamber at a desired heating rate, vapor deposition rate, and cool down rate.

6. The process as in claim 1, wherein the vapor deposition apparatus is supplied with source material from an externally refillable feed system in a manner so as not to interrupt the vapor deposition process or non-stop conveyance of the substrates through the vapor deposition apparatus.

7. The process as in claim 1, wherein the source material is CdTe, and wherein the thin film CdTe layer is deposited over a CdS thin film layer previously applied to the substrates.

8. The process as in claim 1, wherein the substrates comprise glass.

9. A process for vapor deposition of a thin film layer on a photovoltaic module substrate, comprising:
   establishing a vacuum chamber maintained at an operation vacuum;
   introducing glass substrates individually into the vacuum chamber such that the vacuum chamber is maintained at the operational vacuum;
   pre-heating the glass substrates as the glass substrates are conveyed through the vacuum chamber; and
   conveying the pre-heated glass substrates in serial arrangement through a vapor deposition apparatus in the vacuum chamber wherein a thin film layer of a sublimed source material is deposited onto an upper surface of the glass substrates in the vapor deposition apparatus;
   wherein the glass substrates are conveyed through the vapor deposition apparatus at a controlled constant linear speed such that leading and trailing sections of the glass substrate in a conveyance direction are exposed to the same vapor deposition conditions within the vapor deposition apparatus to achieve a substantially uniform thickness of the thin film layer on an upper surface of the glass substrate.

10. The process as in claim 9, further comprising cooling the glass substrates downstream of the vapor deposition apparatus within the vacuum chamber, and subsequently individually removing each of the cooled glass substrates from the vacuum chamber.

11. The process as in claim 10, further comprising post-heating the glass substrates as the glass substrates exit the vapor deposition apparatus and prior to cooling the glass substrates so that the glass substrates are not cooled until the entire glass substrate has exited the vapor deposition apparatus.

12. The process as in claim 9, wherein the glass substrates are individually introduced into the vacuum chamber through an entry vacuum lock process, and individually removed from the vacuum chamber through an exit vacuum lock process such that vacuum within the vacuum chamber is maintained during entry and exit of the glass substrates.

13. The process as in claim 9, wherein the vacuum chamber is defined by a plurality of interconnected modular units, with each of the modular units having an independent conveyor, the process further comprising:
   controlling the individual conveyors to achieve an overall continuous flow of the glass substrates through the vacuum chamber at a desired heating rate, vapor deposition rate, and cool down rate.

14. The process as in claim 9, wherein the vapor deposition apparatus is supplied with source material from an externally refillable feed system in a manner so as not to interrupt the vapor deposition process or non-stop conveyance of the glass substrates through the vapor deposition apparatus.

15. The process as in claim 9, wherein the source material is CdTe, and wherein the thin film layer is deposited over a CdS thin film layer previously applied to the glass substrates.

16. A process for vapor deposition of a thin film layer on a photovoltaic module substrate, comprising:
   establishing a vacuum chamber maintained at an operational vacuum;
   introducing glass substrates individually into the vacuum chamber such that the vacuum chamber is maintained at the operational vacuum;
   pre-heating the glass substrates as the glass substrates are conveyed through the vacuum chamber;
   conveying the pre-heated glass substrates in serial arrangement through a vapor deposition apparatus in the vacuum chamber; and
   depositing a thin film CdTe layer onto an upper surface of the glass substrates in the vapor deposition apparatus;
   wherein the glass substrates are conveyed through the vapor deposition apparatus at a controlled constant linear speed such that leading and trailing sections of the glass substrate in a conveyance direction are exposed to the same vapor deposition conditions within the vapor deposition apparatus to achieve a substantially uniform thickness of the thin film CdTe layer on an upper surface of the glass substrate.

* * * * *